(12) United States Patent
Tauchi et al.

(10) Patent No.: US 8,152,976 B2
(45) Date of Patent: Apr. 10, 2012

(54) AG-BASED ALLOY SPUTTERING TARGET

(75) Inventors: Yuki Tauchi, Hyogo (JP); Hitoshi Matsuzaki, Hyogo (JP); Naoki Okawa, Tokyo (JP)

(73) Assignees: Kobelco Research Institute, Inc., Kobe-shi (JP); Sony Disc & Digital Solutions Inc., Tokyo (JP)

( * ) Notice: Subject to any disclaimer, the term of this patent is extended or adjusted under 35 U.S.C. 154(b) by 583 days.

(21) Appl. No.: 12/198,520

(22) Filed: Aug. 26, 2008

(65) Prior Publication Data
US 2009/0057141 A1 Mar. 5, 2009

(30) Foreign Application Priority Data

Aug. 29, 2007 (JP) .................................. 2007-222539

(51) Int. Cl.
*C23C 14/00* (2006.01)
(52) U.S. Cl. .............................. 204/298.13; 204/298.12
(58) Field of Classification Search ............. 204/298.12, 204/298.13
See application file for complete search history.

(56) References Cited

U.S. PATENT DOCUMENTS

| | | | |
|---|---|---|---|
| 5,948,497 A | 9/1999 | Hatwar et al. | |
| 6,007,889 A | 12/1999 | Nee | |
| 6,229,785 B1 | 5/2001 | Kitaura et al. | |
| 6,280,811 B1 | 8/2001 | Nee | |
| 6,284,111 B1 * | 9/2001 | Takahashi et al. | 204/298.12 |
| 6,451,402 B1 | 9/2002 | Nee | |
| 6,585,870 B1 * | 7/2003 | Pitcher et al. | 204/298.13 |
| 6,689,444 B2 | 2/2004 | Nakai et al. | |
| 7,022,384 B2 | 4/2006 | Fujii et al. | |
| 7,203,003 B2 | 4/2007 | Nakai et al. | |
| 7,419,711 B2 | 9/2008 | Tauchi et al. | |
| 2002/0034603 A1 | 3/2002 | Nee | |
| 2002/0122913 A1 | 9/2002 | Nee | |
| 2003/0138591 A1 | 7/2003 | Nee | |
| 2003/0215598 A1 | 11/2003 | Nee | |
| 2004/0018334 A1 | 1/2004 | Nee | |
| 2004/0028912 A1 | 2/2004 | Tauchi et al. | |
| 2004/0055882 A1 * | 3/2004 | Hasegawa et al. | 204/298.13 |
| 2004/0151866 A1 | 8/2004 | Nee | |
| 2004/0151867 A1 | 8/2004 | Nee | |

(Continued)

FOREIGN PATENT DOCUMENTS

JP 1-215973 8/1989

(Continued)

OTHER PUBLICATIONS

Machine Translation to Nonaka (JP 2004193553 A) published Jul. 2004.*

(Continued)

*Primary Examiner* — Keith Hendricks
*Assistant Examiner* — John Brayton
(74) *Attorney, Agent, or Firm* — Oblon, Spivak, McClelland, Maier & Neustadt, L.L.P.

(57) ABSTRACT

The invention relates to an Ag-based alloy sputtering target including at least one element selected from the group consisting of Ti, V, W, Nb, Zr, Ta, Cr, Mo, Mn, Fe, Co, Ni, Cu, Al, and Si in a total amount of 1 to 15% by weight, in which the Ag-based alloy sputtering target has an arithmetic mean roughness (Ra) of 2 μm or more and a maximum height (Rz) of 20 μm or more at a sputtering surface thereof.

3 Claims, 3 Drawing Sheets

U.S. PATENT DOCUMENTS

| | | |
|---|---|---|
| 2004/0191463 A1 | 9/2004 | Nee |
| 2004/0226818 A1 | 11/2004 | Takagi et al. |
| 2004/0238356 A1 | 12/2004 | Matsuzaki et al. |
| 2004/0258872 A1 | 12/2004 | Nee |
| 2005/0008883 A1 | 1/2005 | Takagi et al. |
| 2005/0042406 A1 | 2/2005 | Nee |
| 2005/0112019 A1 | 5/2005 | Nakai et al. |
| 2005/0153162 A1 | 7/2005 | Takagi et al. |
| 2005/0170134 A1 | 8/2005 | Nee |
| 2005/0238839 A1 | 10/2005 | Takagi et al. |
| 2005/0287333 A1 | 12/2005 | Takagi et al. |
| 2006/0013988 A1 | 1/2006 | Tauchi et al. |
| 2006/0154104 A1 | 7/2006 | Tauchi et al. |
| 2006/0171842 A1 | 8/2006 | Tauchi et al. |
| 2006/0177768 A1 | 8/2006 | Tauchi et al. |
| 2006/0182991 A1 | 8/2006 | Tauchi et al. |
| 2006/0234001 A1 | 10/2006 | Tauchi et al. |
| 2007/0020139 A1 | 1/2007 | Tauchi et al. |
| 2007/0020426 A1 | 1/2007 | Nakai et al. |
| 2007/0020427 A1 | 1/2007 | Fujii et al. |
| 2007/0141296 A1 | 6/2007 | Nakano et al. |
| 2008/0075910 A1 | 3/2008 | Ohwaki et al. |
| 2008/0131308 A1 | 6/2008 | Tsubota et al. |

FOREIGN PATENT DOCUMENTS

| | | |
|---|---|---|
| JP | 1-215974 | 8/1989 |
| JP | 4-28032 | 1/1992 |
| JP | 4-252440 | 9/1992 |
| JP | 5-258363 | 10/1993 |
| JP | 6-208732 | 7/1994 |
| JP | 6-302027 | 10/1994 |
| JP | 2818206 | 8/1998 |
| JP | 2000-57627 | 2/2000 |
| JP | 2000-169960 | 6/2000 |
| JP | 2001-184725 | 7/2001 |
| JP | 2002-511115 | 4/2002 |
| JP | 2003-160826 | 6/2003 |
| JP | 2004-158145 | 6/2004 |
| JP | 2004193553 A * | 7/2004 |
| JP | 2004238655 A * | 8/2004 |
| WO | WO 98/09823 | 3/1998 |

OTHER PUBLICATIONS

Machine Translation to Ueno (JP 2004238655 A) published Aug. 2004.*
U.S. Appl. No. 12/261,781, filed Oct. 30, 2008, Matsuzaki.
U.S. Appl. No. 11/748,739, filed May 15, 2007, Sakamoto et al.
U.S. Appl. No. 12/625,022, filed Nov. 24, 2009, Matsuzaki et al.
U.S. Appl. No. 12/604,858, filed Oct. 23, 2009, Takagi et al.
U.S. Appl. No. 12/266,065, filed Nov. 6, 2008, Tauchi et al.
U.S. Appl. No. 12/513,254, filed May 1, 2009, Sakamoto et al.
U.S. Appl. No. 12/866,230, filed Aug. 4, 2010, Jiko et al.
U.S. Appl. No. 12/915,138, filed Oct. 29, 2010, Tauchi et al.
S. D. Dahlgren, et al., "Reduced Sputtering Yields for Two-Phase Ag-Ni and Ag-Co Targets", Journal of Applied Physics, vol. 43, No. 4, XP-002498351, Apr. 1972, pp. 1514-1517.
K. W. Pierson, et al., "Total sputtering yield of Ag/Cu alloys for low energy argon ions", Nuclear Instruments and Methods in Physics Research, vol. B108, No. 3, XP-002498350, Feb. 1996, pp. 290-299.
U.S. Appl. No. 12/167,597, filed Jul. 3, 2008, Takagi et al.
U.S. Appl. No. 12/100,823, filed Apr. 10, 2008, Tauchi et al.
U.S. Appl. No. 12/183,700, filed Jul. 31, 2008, Tauchi et al.
Chinese Office Action issued Nov. 18, 2010, in Patent Application No. 200810212643.7 (with English-language translation).
U.S. Appl. No. 13/062,384, filed Mar. 4, 2011, Jiko et al.
U.S. Appl. No. 13/062,874, filed Mar. 8, 2011, Tauchi et al.
U.S. Appl. No. 13/128,415, filed May 10, 2011, Tauchi et al.
Office Action issued Mar. 31, 2011, in European Patent Application No. 08 015 133.5.
Chinese Office Action dated Apr. 26, 2011 as received in the corresponding Chinese Patent Application No. 200810212643.7 w/English Translation.

* cited by examiner

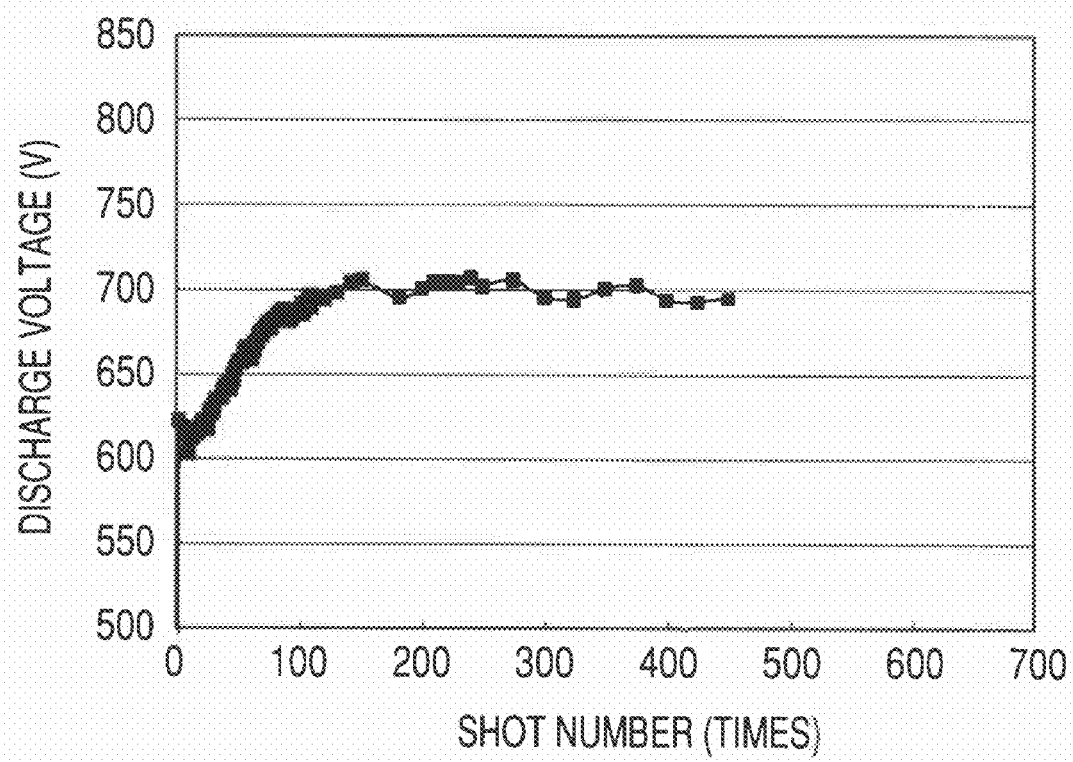

AG-BASED ALLOY SPUTTERING TARGET

FIELD OF THE INVENTION

The present invention relates to an Ag-based alloy sputtering target, and more particularly, it relates to an Ag-based alloy sputtering target capable of reducing the number of pre-sputter operations and shortening the pre-sputter time when it is used for sputtering.

BACKGROUND OF THE INVENTION

A thin film including a silver alloy (i.e., Ag-based alloy thin film) has specific properties, such as high reflectivity, low electrical resistivity, and high thermal conductivity. Therefore, the Ag-based alloy thin film is applied to reflective films of an optical recording medium, electrodes and reflective films of a reflection-type liquid crystal display or the like. In particular, since an Ag-based alloy thin film has high reflectivity with respect to a blue-violet laser which is used in a next-generation optical disk and high thermal conductivity which is required for a write-once-read-many/rewritable disk, the Ag-based alloy thin film is advantageously used as a reflective film or a semi-transmissive reflective film of an optical recording medium.

A sputtering method is suitable to form an Ag-based alloy thin film which is used as the above-mentioned reflective film or the like. The sputtering method of producing thin films is performed in the following way. In a vacuum into which Ar (i.e., Argon) has been injected, a plasma discharge is formed between a substrate and a sputtering target (hereinafter, referred to simply as a "target"), and Ar ionized by this plasma discharge is allowed to collide with the target. As a result, atoms of the target are ejected from the target and are deposited on the substrate to produce thin films. The sputtering method can advantageously form thin films more excellent in film constituents or in the film in-plane uniformity of film thickness than thin films formed by an ion plating method, an electron-beam evaporation method, or a vacuum evaporation method. Therefore, the sputtering method has been widely employed to produce metallic thin films which are used as wiring materials of an integrated circuit, to produce thin films of, for example, a dielectric layer for insulation, or to produce thin films for optical reflection/absorption in optical recording mediums (optical disks) or LED elements as mentioned above.

In general, a target which is used in the sputtering method is produced by obtaining a metal material having a desired element composition according to a dissolving/casting process. However, in an Ag-based alloy target which is used to form Ag-based alloy thin films, there is a problem that Ag and alloy elements other than Ag each of which has a higher melting point than Ag are not sufficiently mixed together when these are dissolved. For example, in an Ag—Ta—Cu alloy target, since the melting point (2977° C.) of Ta is much higher than the melting point (961° C.) of Ag and the melting point (1083.4° C.) of Cu, Ta is not easily melted and it is difficult to produce a target having a uniform element composition. Therefore, when an Ag-based alloy target including Ag and elements each of which greatly differs in melting point from Ag is produced, or when an Ag-based alloy target including Ag and elements each of which is separated from Ag in a liquid phase even if these are melted is produced, it is recommended to produce the Ag-based alloy target according to a powder sintering method in which the powder of each element is used as a raw material.

A target obtained by producing a metallic mixture according to the powder sintering method and then machining the mixture into a target shape is used for sputtering. Generally, an operation called a "pre-sputter" is performed in an initial step of a sputtering process. This "pre-sputter" is a sputtering operation performed to, for example, remove dirt from the surface of a target because sputtering is unstable for the dirt adhering to the surface of the target at the beginning of the use of the target, and the properties of thin films formed as a result are unstable.

However, in an Ag-based alloy target produced by the powder sintering method, in case where the target which is subjected to no treatment after machining is used for sputtering, the number of pre-sputter operations is greatly increased, and the problem of inhibiting the improvement of productivity occurs.

Presumably, this problem is caused by the following two facts (a) and (b). (a) In a target produced by the powder sintering method, there is a greater difference between the distribution state of alloy elements of a machined/altered layer formed on a treated surface of the target by machining and the distribution state of alloy elements inside the target than in a target manufactured by melting/casting method. (b) The sputtering rate of alloy elements in the target is smaller than that of Ag.

For example, the following techniques have so far been proposed as a method of reducing the number of pre-sputter operations.

JP-T-2002-511115 discloses that the surface of a target is pre-processed, and the removal processing time to remove contaminant and/or impurities from the surface of the target when the target is used is shortened. Although chemical polishing or the like is mentioned as a specific method for target surface treatment (see claim 6 in "claims"), a specific means therefor is not described.

Japanese Patent No. 2818206 discloses a target which contains metal having a high melting point and has a surface layer which is subjected to electrolytic polishing in a to-be-sputtered surface of the target. More specifically, "Means and operation for solving the problem" of this patent document discloses that in a target containing metal having such a high melting point, a processed defective layer is formed on the processed surface when the target is machined and ground into a target shape; that if sputtering is performed by using a target having such a processed defective layer on entire surface thereof, ions collide with each other in plasma, and, as a result, fine particles are separated from parts of the processed defective layer which functions as a starting point, of the surface of the target, whereby such particles disadvantageously mixed into a thin film in the form of particles; and that the surface layer of a surface to be sputtered is subjected to electrolytic polishing as a method of swiftly and effectively removing the processed defective layer.

JP-A-1-215974 discloses that the surface of a target is etched by dry etching (see claims). JP-A-2000-169960 discloses that wet grinding or chemical polishing is preferably performed to remove a layer (treated layer or machined/altered layer) still having treatment deformation or oxidation of a target surface caused during finish machining or treatment (see claim 4 in "claims"). However, these patent documents do not disclose a detailed description of such grinding or polishing.

JP-A-1-215973 discloses that the surface of a target is etched by wet etching (see claims). The embodiment therein shows that the surface of a Tb—Fe—Co target is soaked in a nitric acid solution for one minute and that the surface of a Gd—Tb—Fe—Co target is soaked in a buffer-fluorinatedacid solution in which fluorinated acid and ammonium fluoride are mixed together for three minutes.

Any of the techniques disclosed in JP-T-2002-511115, Japanese Patent No. 2818206, JP-A-1-215974, JP-A-2000-169960, and JP-A-1-215973 aims to reduce the number of pre-sputter operations. However, these patent documents do not resolve the problem caused when elements each of which greatly differs in sputtering rate from Ag are added as alloy elements. Therefore, even if the techniques of these patent literatures are applied to the target of the present invention, it is considered to be difficult to reduce the number of pre-sputter operations and shorten the pre-sputter time.

SUMMARY OF THE INVENTION

The present invention has been made in consideration of these circumstances. Therefore, an object of the present invention is to provide an Ag-based alloy sputtering target capable of reducing the number of pre-sputter operations and shortening the pre-sputter time while sputtering is performed.

Namely, the present invention relates to following items 1 to 4.

1. An Ag-based alloy sputtering target (hereinafter, referred to as a "target of the present invention", or simply as a "target" according to circumstances in some cases) including at least one element selected from the group consisting of Ti, V, W, Nb, Zr, Ta, Cr, Mo, Mn, Fe, Co, Ni, Cu, Al, and Si in a total amount of 1 to 15% by weight, in which the Ag-based alloy sputtering target has an arithmetic mean roughness (Ra) of 2 μm or more and a maximum height (Rz) of 20 μm or more at a sputtering surface thereof.

Incidentally, the arithmetic mean roughness (Ra) and the maximum height (Rz) are defined by JISB 0601 (2001).

2. The Ag-based alloy sputtering target according to item 1, which is prepared in accordance with a powder sintering method. Since a target which is produced by the powder sintering method easily becomes uniform in element composition, this method is preferably used for producing the target.

3. The Ag-based alloy sputtering target according to item 2, which is obtained by forming a metallic mixture in accordance with a powder sintering method and machining the metallic mixture to form a target material, followed by subjecting the target material to a wet etching using at least one member selected from the group consisting of a diluted nitric acid having a concentration of 5 to 30 mol % and a hydrogen peroxide solution having a concentration of 5 to 30 mol %.

4. The Ag-based alloy sputtering target according to any one of item 1 to 3, which is used for forming a reflective layer in a read-only optical recording medium.

According to the present invention, it is possible to reduce the number of pre-sputter operations which are performed prior to the formation of a thin film by sputtering, thereby shortening the pre-sputter time. For example, it is possible to form an Ag-based alloy thin film superior in the alloy composition, in the alloy element distribution, and in the in-plane uniformity of film thickness as a reflective film or as a semi-transmissive reflective film for an optical information record medium in the time required at practical level. In particular, since an Ag-based alloy thin film produced by the Ag-based alloy sputtering target of the present invention has high reflectivity, high thermal conductivity, and high durability, the Ag-based alloy thin film of the present invention is useful as a reflective layer in a read-only optical recording medium.

BRIEF DESCRIPTION OF THE DRAWINGS

FIG. 6 is a graph showing the number of shots (the number of pre-sputter operations) until a discharge voltage becomes stable in Example 2.

DETAILED DESCRIPTION OF THE INVENTION

Figure 1:
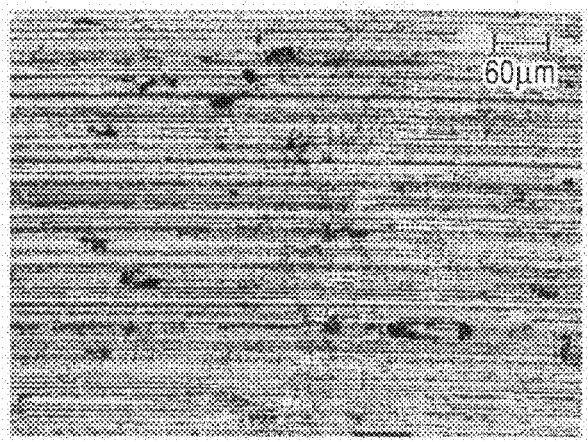
FIG. 1 is an optical microphotograph observation at a magnification of 100 obtained by taking a sputtering surface of a sample (target) in Comparative Example.

In an Ag-based alloy target produced according to the powder sintering method, the number of pre-sputter operations is greatly increased if this target is used for sputtering. Presumably, the reason is correlated with the following two facts (a) and (b) as mentioned above.

(a) There is a greater difference between the distribution state of alloy elements of a machined/altered layer formed on a treated surface of the target by machining and the distribution state of alloy elements inside the target than in a target manufactured by melting/casting method.

(b) The sputtering rate of alloy elements in the target is smaller than that of Ag.

The present inventors have further studied a causal relationship between the increase in the number of pre-sputter operations and the causes (a) and (b). As a result, it is found that the following phenomena are occurring.

A machined/altered layer differing in the distribution state of alloy elements from the inside of a target is formed on the surface of the target which is not sputtered. However, since this machined/altered layer is removed by a pre-sputter, the element composition of the target surface becomes substantially equal to the mixture ratio of each powder that is a raw material during the period from the beginning to the middle of the pre-sputter. However, in the target of the present invention, sputtering is not stable during this period.

The target of the present invention contains at least one metal selected from the group consisting of Ti, V, W, Nb, Zr, Ta, Cr, Mo, Mn, Fe, Co, Ni, Cu, Al, and Si. These alloy elements (Ti, V, W, Nb, Zr, Ta, Cr, Mo, Mn, Fe, Co, Ni, Cu, Al, and Si) has a smaller sputtering rate than Ag, and Ag which is a matrix is sputtered by priority. Therefore, the composition of a formed thin film approximates closely to Ag which is the matrix. With further proceeding of sputtering, particles of the alloy elements which has a small sputtering rate are exposed, and the sputtering frequency of the alloy elements is increased. Only after this process, it has been found that a thin film having a composition which corresponds to the element composition of the target can be obtained, and sputtering becomes stable.

In other words, in the target of the present invention, the fact (b) mentioned above is a major cause by which the number of pre-sputter operations is increased. Therefore, the stability of sputtering cannot be sufficiently achieved only by the removal of the machined/altered layer formed by machining. Presumably, sputtering does not become stable until the surface of the target reaches a state in which particles of the alloy elements small in sputtering rate are exposed.

In consideration of these circumstances, the present inventors have studied a specific process under the idea that a target in which a surface thereof has been beforehand processed to have the form of the stability of sputtering is preferably provided for sputtering.

First, to study the degree to which the particles of alloy elements which has a smaller sputtering rate than Ag are exposed so that the number of pre-sputter operations can be reduced and so that the pre-sputter time can be shortened, the present inventors examined the relationship between the degree of projection of the particles on the sputtering surface of the target and the sputtering times (i.e., the number of shots) which are required until sputtering becomes stable. As a result, the present inventors reached the conclusion that the number of pre-sputter operations can be reduced more greatly than the conventional target by forming a sputtering surface of the target so that the target has a arithmetic mean roughness (Ra) of 2 μm or more and a maximum height (Rz) of 20 μm or more, as shown in Examples described later. If the maximum height is too large, the particles of alloy elements reach an unnecessarily projected state, and the amount of the alloy elements in a formed thin film are increased. Therefore, the upper limit of the maximum height is preferably about 80 μm, depending on the particle size of using powder. If the arithmetic mean roughness is too large, the particles of alloy elements reach an unnecessarily projected state, and the amount of the alloy elements in a formed thin film are increased, and, in addition, the number of pre-sputter operations is increased until the thin-film forming speed is stabilized. Therefore, the arithmetic mean roughness is preferably 10 μm or less.

Additionally, the present inventors have confirmed that the number of particles of alloy elements which have an area of 100 $\mu m^2$ or more exceeds five in total per 0.25 $mm^2$ of the sputtering surface when the sputtering surface of the target is observed with an optical microscope under the condition that the arithmetic mean roughness (Ra) is 2 μm or more and that the maximum height (Rz) is 20 μm or more. It is considered that this surface form makes it possible that particles of alloy elements which have the small sputtering rate are easily spattered and that the number of pre-sputter operations is reduced.

The following process is preferable to obtain a target in which a sputtering surface has the above-mentioned surface roughness. That is, the process includes: forming a metallic mixture by the powder sintering method; machining to form a target material having a target shape; and subjecting to wet etching so as to preferentially dissolve at least Ag of the sputtering surface of the target material. For example, in an Ag—Ta—Cu target, Ta and Cu have a smaller sputtering rate than Ag. Therefore, it is preferable to selectively remove Ag and to allow Ta particles and Cu particles to project on the target surface so as to increase the surface area of these elements.

In order to preferentially dissolve Ag as mentioned above, it is preferable to perform wet etching using a diluted nitric acid and/or a hydrogen peroxide solution as an acid solution. An acid having strong oxidative power such disclosed above is preferably used. If a hydrochloric acid or a sulfuric acid is used, Ag is not dissolved, and alloy elements other than Ag are dissolved. Therefore, it is difficult to form a target surface specified by the present invention.

A concentration of the diluted nitric acid is preferably 5 to 30 mol %. A concentration of the hydrogen peroxide solution is preferably 5 to 30 mol %. If each of acid solutions has a concentration less than 5 mol %, the etching time becomes long to reach the specified arithmetic mean roughness and the specified maximum height. This is undesirable in view of low productivity. More preferably, each has a concentration of 8 mol % or more. On the other hand, if each of acid solutions has a concentration exceeding 30 mol %, the etching speed becomes too high. This is undesirable because the control to reach the specified arithmetic mean roughness and the specified maximum height becomes difficult. More preferably, each has a concentration of 15 mol % or less.

A target material is soaked in the acid solution. In order to reach the specified arithmetic mean roughness and the specified maximum height, the soaking time is preferably 30 seconds or more (more preferably, 60 seconds or more). If the soaking time is too long, the shape of the target is changed by dissolution. Therefore, the soaking time is preferably 5 minutes or less.

A temperature of the above-mentioned acid solution is set at, for example, about 25° C. If the temperature is low, since the etching speed becomes low, it is preferable to appropriately lengthen the soaking time.

Incidentally, Fe, Co, Ni, Cu, and Al of the alloy elements contained in the target are metals having higher chemical activity than Ag. Therefore, these metals are liable to be dissolved earlier than Ag when these are soaked in the above-mentioned acid solution. Therefore, if the target material contains at least one alloy element selected from the group consisting of Fe, Co, Ni, Cu, and Al, in order to inhibit the loss of the alloy elements when wet etching is performed, it is preferable to use an inhibitor (a dissolution preventing inhibitor) that prevents these alloy elements from being dissolved so as to dissolve only Ag.

It is preferable to use the inhibitor by adding to the above-mentioned diluted nitric acid and/or the above-mentioned hydrogen peroxide solution (preferably the hydrogen peroxide solution).

More specifically, as the inhibitor for a target material containing Fe, Co, and Ni, chromate, nitrite, molybdate, thiourea, propyl sulfide, or diacylamine may be mentioned. As the inhibitor for a target material containing Al, cerium chloride may be mentioned. Also, as the inhibitor for a target material containing Cu, benzotriazole, monochloroacetic acid, glucose, or fructose may be mentioned, and "AGRIP 940" manufactured by Meltex Inc. may be used as a commercially available additive.

The Ag-based alloy target of the present invention contains at least one metal selected from the group consisting of Ti, V, W, Nb, Zr, Ta, Cr, Mo, Mn, Fe, Co, Ni, Cu, Al, and Si in a total amount of 1 to 15% by weight. It is possible to form a thin film sufficiently having specific properties, such as high reflectivity, low electrical resistivity, and high thermal conductivity, required of reflective films of an optical recording medium or electrodes and reflective films of a reflection-type liquid crystal display by using the target containing 1% or more by weight of such a metal. On the other hand, if these alloy elements are excessively contained, it is difficult to obtain a thin film having the above-mentioned properties such as high reflectivity. Therefore, the amount thereof is preferably 15% or less by weight.

Of these, an Ag—X—Cu alloy target (X is at least one metal of Ti, W, Ta, V, Mo, Nb, and Zr) containing 1 to 10% by weight of X and 1 to 10% by weight of Cu is useful as a reflective layer of an optical recording medium. In particular, an Ag—Ta—Cu alloy target containing 3 to 10% by weight of Ta and 1 to 5% by weight of Cu is preferable because this alloy target can form thin films superior not only in the above-mentioned properties, such as high reflectivity, high thermal conductivity, and high durability, but also in laser marking properties in ID marking in which a reflective film is bored or deformed with a laser for the purpose of, for example, copy protection.

As mentioned above, the Ag-based alloy target which is used in the present invention contains at least one metal selected from the group consisting of Ti, V, W, Nb, Zr, Ta, Cr, Mo, Mn, Fe, Co, Ni, Cu, Al, and Si in a total amount of 1 to 15% by weight, and the remainder contains Ag and inevitable impurities. As the inevitable impurities, elements (e.g., carbon, nitrogen, and oxygen) which are inevitably mixed during, for example, a manufacturing process may be mentioned.

In the present invention, in order to obtain a target having a uniform element composition, it is preferable to produce the target by the powder sintering method as mentioned above. More specifically, for example, such a target can be produced through the process such as following order: powder mixing; capsule filling; capsule deaerating; hot isostatic pressing (HIP); capsule removing; peeling; slicing; machining. Although strict regulations are not imposed on specific conditions of the target producing process, powder mixing and HIP (hot isostatic pressing) is preferably performed under the following conditions.

Powder Mixing Process

Initially, it is preferable to provide alloy element powders having the same size (particle size distribution) as an Ag powder as a raw powder. If a powder having uniform particle size distribution is used as a raw material, segregation occurred in powder mixing process can be prevented, and the raw material can be uniformly mixed. More specifically, it is preferable to use a raw material having a median particle diameter of 10 to 50 μm. The term "median particle diameter" denotes a particle diameter at a position where the cumulative volume ratio is 50% when a relational curve between the particle diameter of the powder and the cumulative volume ratio is calculated according to a sieving method under the condition that the entire volume of the powder is 100%.

Thereafter, the raw material containing each powder mentioned above is mixed for 30 to 90 minutes. If the mixing time is a short time of less than 30 minutes, the alloy powders are not mixed together sufficiently and uniformly. On the other hand, since the raw powders uniformly mixed together is brought into a separated state, a long time exceeding 90 minutes of the mixing time is not preferable. More preferably, the mixing time is 40 to 70 minutes.

HIP Process

When HIP is performed by using a mixed powder obtained as above, it is preferably performed for 1 to 3 hours at a temperature of 500° C. to 600° C. If the temperature of HIP is too low or if the time of HIP is too short, sintering becomes insufficient, and hence this is undesirable. On the other hand, if the temperature of HIP is too high or if the time of HIP is too long, an alloy phase is generated at an interface between Ag and alloy elements, and an abnormal electrical discharge, such as arcing, is caused when sputtering is performed while allowing the alloy phase to function as a starting point, and hence thin films cannot be formed. This is undesirable. More preferably, the temperature of HIP is 520 to 580° C. More preferably, the time of HIP is 1.5 to 2.5 hours.

A metal body obtained by the powder sintering method is machined by, for example, a lathe or a miller into a target shape.

The target of the present invention can be applied to any of, for example, a DC sputtering method, an RF sputtering method, a magnetron sputtering method, and a reactive sputtering method, and is effective to form an Ag-based alloy thin film of about 20 to 5000 Å.

No specific limitations are imposed on the thickness of the Ag-based alloy target. Preferably, the thickness of the Ag-based alloy target roughly falls within 1 to 50 mm so that a target suitable to obtain a desired thin film can be obtained.

EXAMPLES

The present invention will be hereinafter described in more detail according to examples. However, these examples do not limit the present invention, and can be appropriately modified within the range adaptable to the essentials of the present invention mentioned above and later, and are all included within the technical range of the present invention.

An Ag powder, a Ta powder, and a Cu powder each of which has a median particle diameter of 15 μm to 30 μm were put into a mixer at the ratio 85:10:5 by weight, and were mixed together for 60 minutes.

When a target is produced by the powder sintering method, if powders to be mixed greatly vary in particle diameter, there is a possibility that segregation is caused while these powders are mixed together. Therefore, in the present invention, an Ag powder, a Ta powder, and a Cu powder each of which is available and has a median particle diameter of 15 to 30 μm were used to uniform the particle diameters of the powders to be mixed.

Thereafter, the mixed powders were packed into a cylindrical capsule, and were heated and held at 400° C. for 9 hours. Thereafter, air was expelled from the inside of the capsule so that the inside of the capsule reaches a vacuum state.

Thereafter, the capsule that had been deaerated was subjected to HIP. More specifically, HIP was performed under the condition that the HIP temperature is 550° C. and that the HIP time is 2 hours.

After performing the HIP, the capsule was removed, and a cylindrical Ag—Ta—Cu alloy material was taken out. Thereafter, the surface of the Ag—Ta—Cu alloy material was subjected to peeling, followed by slicing. As a result, disk-shaped Ag—Ta—Cu alloy materials were obtained.

The disk-shaped Ag—Ta—Cu alloy material obtained in this way was machined (lathed), and was finished into a disk-shaped Ag—Ta—Cu alloy target material having a diameter of about 210 mm and a thickness of about 10 mm. A sample of this Ag—Ta—Cu alloy target material was used as Comparative Example.

Furthermore, the Ag—Ta—Cu alloy target material was subjected to wet etching in which the material is soaked in a diluted nitric acid of 10 mol % for 3 minutes, and a sample obtained by selectively dissolving Ag and Cu lying on the surface of the target was used as Example 1.

Furthermore, the Ag—Ta—Cu alloy target material was soaked in a diluted nitric acid of 10 mol % for 3 minutes, and then was soaked for 90 seconds in a solution in which "AGRIP 940" (manufactured by Meltex Inc.) is mixed with a hydrogen peroxide solution having a concentration of 30% by weight (i.e., a hydrogen peroxide solution having a concentration of about 15 mol %) (volume ratio of hydrogen peroxide solution: water: AGRIP 940=5:4:1). As a result, a sample obtained by selectively dissolving only Ag on the surface of the target was used as Example 2.

These samples were used, and the surfaces thereof were observed with an optical microscope, and the arithmetic mean roughness (Ra) and the maximum height (Rz) were measured with a surface roughness meter. Furthermore, sputtering was performed by using these samples, and the number of shots (the number of pre-sputter operations) until a discharge voltage (sputtering voltage) is stabilized was measured.

Figure 2:
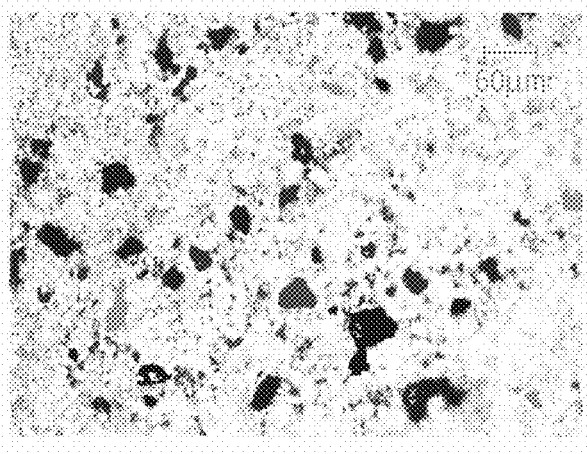
FIG. 2 is an optical microphotograph observation at a magnification of 100 obtained by taking a sputtering surface of a sample (target) in Example 1.
Figure 3:
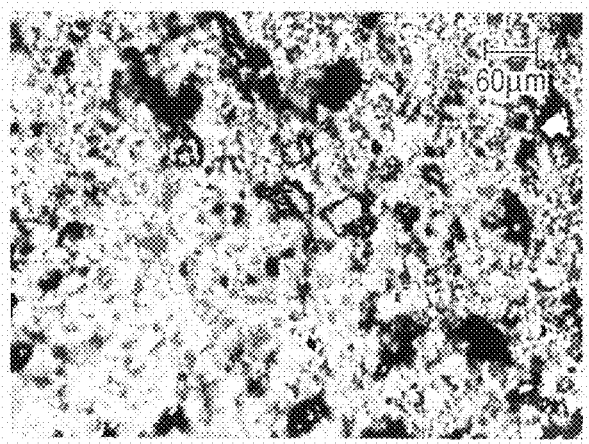
FIG. 3 is an optical microphotograph observation at a magnification of 100 obtained by taking a sputtering surface of a sample (target) in Example 2.

Photographs of the sputtering surface of the target or of the target material observed with the optical microscope are shown in FIG. 1 of the Comparative Example, in FIG. 2 of Example 1, and in FIG. 3 of Example 2m, respectively. Horizontal lines of FIG. 1 are marks made by machining. It was confirmed by a fluorescent X-ray analysis method that, in FIG. 2 and FIG. 3, black particles are Ta particles, gray particles (red particles in a color picture) are Cu particles, and the others (remainder) are Ag particles.

The arithmetic mean roughness (Ra) and the maximum height (Rz) (hereinafter, these are referred to generically as a "surface roughness" according to circumstances in some cases) were measured with a surface roughness measuring device SJ-301 manufactured by Mitutoyo Corporation. The evaluation length was 4 mm. In the measurement of the sample of the Comparative Example, the arithmetic mean roughness (Ra) and the maximum height (Rz) were measured in a direction at an angle of 90 degrees with the longitudinal direction of the marks made by machining. Table 1 shows these measurement results.

TABLE 1

|  | Arithmetic mean roughness (Ra) | Maximum height (Rz) |
| --- | --- | --- |
| Comparative Example | 0.8 μm | 4.9 μm |
| Example 1 | 2.8 μm | 31.2 μm |
| Example 2 | 3.8 μm | 26.8 μm |

The number of shots (the number of pre-sputter operations) until a discharge voltage (sputtering voltage) is stabilized was measured under the following conditions.

Measurement Conditions
DC Magnetron Sputtering Method

| Sputtering power: | 20 W/cm$^2$ |
| --- | --- |
| Ar gas pressure: | 1 Pa or less |
| Sputtering time for one operation: | 1 second |
| Film thickness for one operation: | About 40 nm |
| Substrate: | Polycarbonate |

Figure 4:
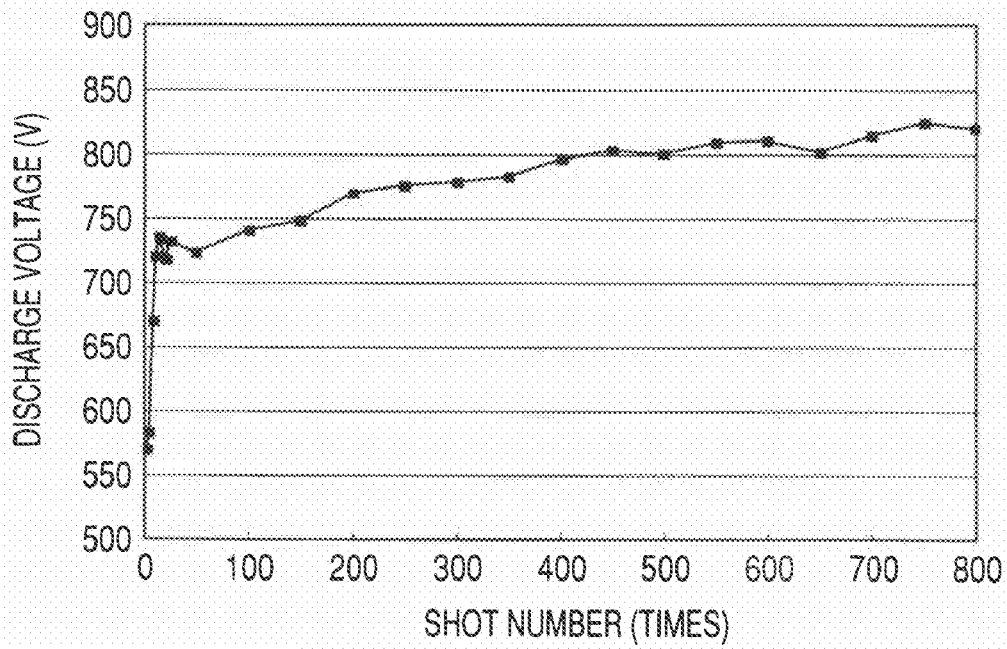
FIG. 4 is a graph showing the number of shots (the number of pre-sputter operations) until a discharge voltage becomes stable in Comparative Example.

In the above-mentioned sputtering, the sputtering power and the sputtering time were adjusted so that the thickness of a film formed by a single sputtering operation becomes about 40 nm. A graph showing the number of shots (the number of pre-sputter operations) until a discharge voltage (sputtering voltage) is stabilized is shown in FIG. 4 of the Comparative Example, in FIG. 5 of Example 1, and in FIG. 6 of Example 2, respectively.

These results bring about the following consideration. Namely, in the sample of the Comparative Example, since the surface roughness does not satisfy the regulations of the present invention (see Table 1), the number of shots until a discharge voltage is stabilized is 700, which is a remarkably large number, as shown in FIG. 4.

Additionally, from a photograph of FIG. 1 obtained by observing the sputtering surface of the sample of Comparative Example with the optical microscope, it is understood that the sputtering surface is covered with a machined/altered layer and that Ta particles and Cu particles are absent on the surface. Presumably, since the sputtering surface was in this state, the number of shots became large until the surface form reached a state in which Ta particles and Cu particles were projected there.

Figure 5:
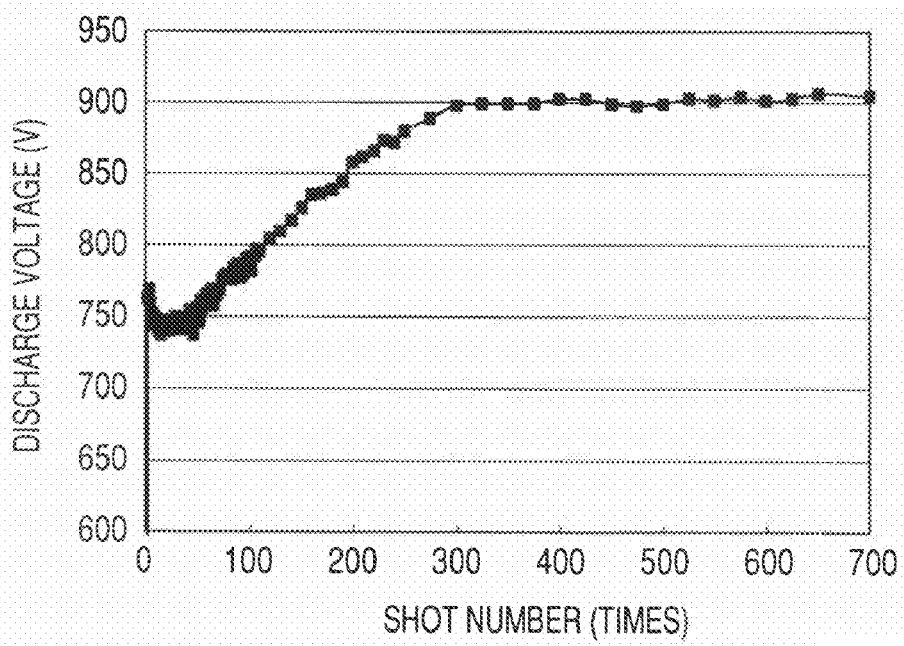
FIG. 5 is a graph showing the number of shots (the number of pre-sputter operations) until a discharge voltage becomes stable in Example 1.

In contrast, in the sample of Example 1, since the surface roughness satisfies the regulations of the present invention (see Table 1), as shown in FIG. 5, the number of shots until a discharge voltage is stabilized is 300, which is less than half that of Comparative Example. Additionally, from a photograph of FIG. 2 observed with the optical microscope, it is understood that the sputtering surface of the sample of Example 1 has a form in which Ta particles have been projected, and that 30 particles of Ta having an area of 100 to 400 μm$^2$ are present on each sputtering surface of 0.25 mm$^2$ in total. Presumably, Ta, which is small in sputtering rate, on the sputtering surface, is in a state of being easily sputtered in this way, and hence sputtering was stabilized by such a small number of pre-sputter operations.

Likewise, in the sample of Example 2, since the surface roughness satisfies the regulations of the present invention (Table 1), as shown in FIG. 6, the number of shots until a discharge voltage is stabilized is 150, which is much smaller than that of Comparative Example. In Example 2, a Cu-dissolution preventing inhibitor was used when wet etching was performed. Therefore, from a photograph of FIG. 3 obtained by observing the sputtering surface of the sample of Example 2 with the optical microscope, it is understood that Cu particles, as well as Ta particles, are projected on the surface of the target. Additionally, from this photograph, it is understood that 36 particles of Ta and Cu having an area of 100 to 400 μm$^2$ in total are present on each sputtering surface of 0.25 mm$^2$. In Example 2, the particles of the alloy elements are greater in number than in Example 1, and Ta and Cu, which are small in sputtering rate, are in a state of being easily sputtered. Therefore, presumably, sputtering was stabilized by an even smaller number of pre-sputter operations.

Although the present invention has been described in detail with reference to the specific aspects, it is apparent for persons skilled in the art that the present invention can be variously changed or modified without departing from the spirit and the scope of the present invention.

This application is based on Japanese Patent Application No. 2007-222539, filed in Japan Patent Office on Aug. 29, 2007, the entire contents of which are hereby incorporated by reference.

Additionally, all the references cited herein are incorporated as a whole.

What is claimed is:

1. An Ag-based alloy sputtering target comprising an Ag—Ta—Cu alloy target comprising 3 to 10% by weight of Ta and 1 to 5% by weight of Cu
    wherein the Ag-based alloy sputtering target has an arithmetic mean roughness (Ra) of 2 μm or more and a maximum height (Rz) of 20 μm or more at a sputtering surface thereof.

2. The Ag-based alloy sputtering target according to claim 1, which is prepared in accordance with a powder sintering method.

3. The Ag-based alloy sputtering target according to claim 2, which is obtained by forming a metallic mixture in accordance with a powder sintering method and machining the metallic mixture to form a target material, followed by subjecting the target material to a wet etching using at least one member selected from the group consisting of a diluted nitric acid having a concentration of 5 to 30 mol % and a hydrogen peroxide solution having a concentration of 5 to 30 mol %.

\* \* \* \* \*